(12) United States Patent
Jain

(10) Patent No.: US 8,791,598 B2
(45) Date of Patent: Jul. 29, 2014

(54) SYSTEM AND METHOD FOR SELECTIVELY CONTROLLING A SOLAR PANEL IN SEGMENTS

(75) Inventor: Babu Jain, Cupertino, CA (US)

(73) Assignee: NavSemi Energy Private Ltd., Singapore (SG)

( * ) Notice: Subject to any disclaimer, the term of this patent is extended or adjusted under 35 U.S.C. 154(b) by 1058 days.

(21) Appl. No.: 12/643,266

(22) Filed: Dec. 21, 2009

(65) Prior Publication Data

US 2010/0154858 A1    Jun. 24, 2010

Related U.S. Application Data

(60) Provisional application No. 61/139,603, filed on Dec. 21, 2008.

(51) Int. Cl.
*H01L 31/042* (2014.01)

(52) U.S. Cl.
USPC .................................. 307/77; 307/71; 307/78

(58) Field of Classification Search
USPC .............................................. 307/71, 77, 78
See application file for complete search history.

(56) References Cited

U.S. PATENT DOCUMENTS

| | | | |
|---|---|---|---|
| 4,086,485 A | 4/1978 | Kaplow et al. | |
| 4,333,136 A | 6/1982 | Baker | |
| 6,433,522 B1 | 8/2002 | Siri | |
| 6,690,590 B2 | 2/2004 | Stamenic et al. | |
| 7,864,497 B2 * | 1/2011 | Quardt et al. | 361/92 |
| 2001/0043050 A1 | 11/2001 | Fisher, Jr. | |
| 2004/0207366 A1 | 10/2004 | Sung | |
| 2005/0172995 A1 * | 8/2005 | Rohrig et al. | 136/243 |
| 2006/0017327 A1 | 1/2006 | Siri et al. | |
| 2006/0185727 A1 | 8/2006 | Matan | |
| 2008/0164766 A1 | 7/2008 | Adest et al. | |
| 2008/0238195 A1 | 10/2008 | Shaver et al. | |
| 2009/0078300 A1 | 3/2009 | Ang et al. | |

FOREIGN PATENT DOCUMENTS

| | | |
|---|---|---|
| EP | 2 056 180 A1 | 5/2009 |
| JP | 08-191573 | 7/1996 |
| WO | WO 95/33283 | 12/1995 |
| WO | WO 2006/005125 A1 | 1/2006 |

OTHER PUBLICATIONS

International Search Report and Written Opinion of Aug. 13, 2010 in International Application No. PCT/US2009/068946.
International Search Report and Written Opinion issued in corresponding International Application No. PCT/US10/045737, dated Mar. 4, 2011.
International Preliminary Report on Patentability as issued in corresponding international application PCT/US2010/045737, dated Mar. 1, 2012.
International Search Report and Written Opinion as issued in corresponding international application PCT/US2011/034217, dated Jan. 13, 2012.

* cited by examiner

*Primary Examiner* — Fritz M Fleming
(74) *Attorney, Agent, or Firm* — Mahamedi Paradice LLP

(57) ABSTRACT

A control system is provided for a solar panel. The control system includes a plurality of control elements that are individually connected to a corresponding segment of the solar panel. The control system also includes control logic that is structured to individually signal each of the plurality of control elements in order to cause the signaled control element to either switch-off or alter performance output to maximize the over all output of a solar panel or solar power generating system utilizing such panels.

20 Claims, 5 Drawing Sheets

SYSTEM AND METHOD FOR SELECTIVELY CONTROLLING A SOLAR PANEL IN SEGMENTS

PRIORITY CLAIM

This patent application claims the benefit of the U.S. provisional patent application having Ser. No. 61/139,603, filed Dec. 21, 2008; the aforementioned application being hereby incorporated by reference in its entirety.

TECHNICAL FIELD

Embodiments described herein pertain generally to a system and method for selectively controlling a solar panel in segments.

BACKGROUND

Conventional solar panels typically interconnect solar cells in series, with panel-level control using flying diodes to "shut-off" the entire panel or part of the panel when output is compromised.

BACKGROUND

Conventional solar panels typically interconnect solar cells in series, with panel-level control to "shut-off" the panel when output is compromised. FIG. 7 illustrates a conventional control system for a solar panel, under the prior art. A solar panel 702 includes segments 710 that are interconnected to a junction box 706. The junction box 706 is connected to an inverter 715, which has a maximum power point tracker (MPPT) component 725 that monitors and controls the whole panel. Under a convention system, the MPPT tracks the maximum power point for the complete panel. Under a conventional approach, the segments 710, 712, 714 are individually controllable to switch off using a corresponding diode 710, 712, 714. The diodes 710, 712, 715 shut off the corresponding segment 710, 712, 714 if an output of the segment drops below a minimum threshold. The MPPT tries to adjust voltage/current values from the output of the whole panel in order to maximize the output power of the whole panel. Under the conventional approach, MPPT, however, is unable to control individual segments to achieve true maximization.

DETAILED DESCRIPTION

Embodiments described herein provide for segmenting control of a solar panel in order to maximize the power output from the solar panel. As described, a solar panel can be segmented and controlled on a per-segment basis in order to enhance performance of the entire solar panel.

In an embodiment, a solar panel is structured to provide a plurality of segments that are electrically interconnected in parallel. A control element is provided for each individual segment. The control element is configured to control an output from that segment independent of an output from other segments that comprise the solar panel.

In some embodiments, the control element for each one of the plurality segments includes a control and switch component ("CSC") that is structured to (i) adjust an electrical output of that segment independent of an electrical output of other segments, (ii) cut-off that segment without affecting an output of other segments that comprise the solar panel.

Still further, some embodiments include control logic that is coupled to each of the plurality of segments. The control logic is capable of individually signaling the control associated with each one of the segments in order to cut-off or alter performance of that segment.

In some embodiments, a control system is provided for a solar panel. The control system includes a plurality of control elements that are individually connected to a corresponding segment of the solar panel. The control system also includes control logic that is structured to individually signal each of the plurality of control elements in order to cause the signaled control element to either switch-off or alter performance output.

A control system described with embodiments herein may be used to control a solar panel comprising segments that are electrically connected in series or in parallel.

Still further, in some embodiments, a solar panel is controlled by identifying a plurality of segments that form the solar panel. The plurality of segments may be electrically connected in series and/or in parallel. Each of the segments is provided a control element to control an output of that segment. The individual control elements are selectively controlled in order to affect an output from a corresponding segment of the panel.

As used herein, a "solar panel" is a packaged or interconnected assembly of photovoltaic cells ("solar cells"). A "segment" of a solar panel includes one or more cells, including one cell or multi-cell clusters. A segment may also correspond to a region of a solar panel. According to at least some embodiments, a panel is a package of solar cells that include electrical terminals for providing an output of collective solar cells that are provided with the package.

System Description

Figure 1:
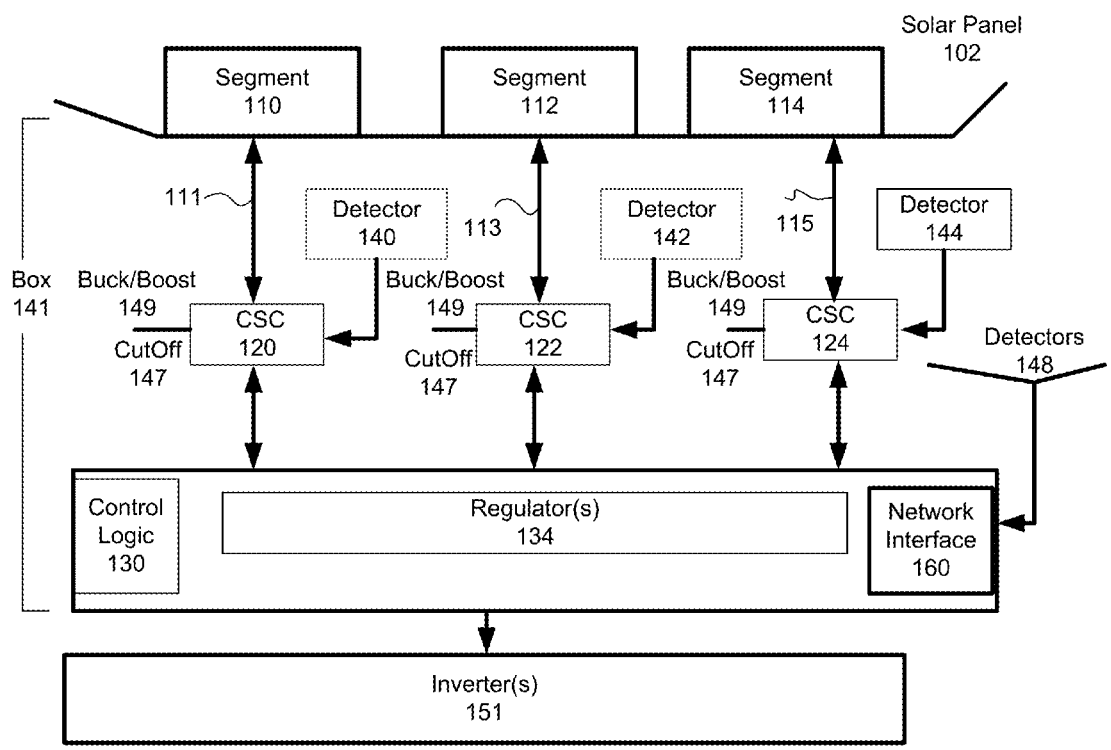
FIG. 1 illustrates a controlled solar panel assembly, in accordance with one or more embodiments.

FIG. 1 illustrates a controlled solar panel assembly, in accordance with one or more embodiments. A solar panel assembly 102 includes segments 110, 112, 114, which can be interconnected in series (as shown) and/or in parallel. Each segment includes one or more solar cells. In operation, the segments 110, 112, 114 form a panel, and the individual segments supply power on power lines 111, 113, 115 to a regulator 134, which in turn outputs power terminal of the junction box which is generally connected to inverters 151 or energy storage elements such as one or more batteries. The inverters convert the output of the panel 102 into AC form. Some embodiments described include an intelligent junction box 141, which includes control logic 130 and voltage/current regulators 134. The combined output of the segments 110, 112, 114 is controlled individually, and regulated on both the segments and at the regulator 134 in order to maximize or optimize the power output of the panel or system connecting the panels.

According to some embodiments, the junction box 141 can be structured to receive power from more than one panel, and furthermore to use its resources, including control logic 130, to selectively control segments of multiple panels that feed into the junction box.

System 100 further includes a plurality of control and switch component (CSC) 120, 122, 124. Each CSC is formed by a combination of elements, and individually assigned to a corresponding one of the segments 110, 112, 114. As described below, each CSC includes (i) a resource or component 147 for switching a corresponding one of the segments off, without affecting operation of other segments that comprise the panel; and/or (ii) a voltage booster to boost voltage as needed to enable power usage from the segment and/or (iii) a voltage buck converter to lower voltage as needed to enable power usages from the segment (collectively booster and buck converter are identified as a common element 149, although some embodiments may utilize only one of the buck converter or booster). Each resource 147 can be implemented as part of a maximum power point tracker (MPPT) in combination with one of the segment detectors 140, 142, 144. As an addition or alternative, the detectors 140, 142, 144 may include segment-specific sensors, such as those that detect luminosity (thereby detecting luminosity at a particular region of the panel). The CSC 120, 122, 124 may switch or control output in response to the occurrence of predetermined conditions. Detection (of the predetermined conditions) may be made on individual segments, apart from other segments, or on a panel (or multi-segment) basis. More specifically, segment detectors 140, 142, 144 can be used to detect segment-specific predetermined conditions. In particular, the segment detectors 140, 142, 144 may monitor electrical output on the corresponding segment, and then boost or switch the segment out in response to the electrical output dropping to predetermined thresholds. In some implementations, at least portions of the CSC 120, 122, 124 and/or detectors 140, 142, 144 are provided as integrated circuitry and electronics with the panel 102.

The system 100 further comprises control logic 130 that is connected to the individual CSC 120, 122, 124. The control logic 130 is configured to trigger (i) switching and/or (ii) boosting or bucking in individual CSC 120, 122, 124. The control logic 130 is able to selectively trigger individual CSC 120, 122, 124 to switch/boost/buck corresponding segment off (or on) in response to detecting panel-level designated conditions. In addition to segment detectors 140, 142, 144, the control logic 130 uses a combination of resources to detect the predetermined conditions.

According to some embodiments, the predetermined conditions (whether detected centrally, from control logic 130, or from segment detectors 142, 144, 146) are detected by panel-level detectors, such as voltage/current sensors, external sensors 148 (e.g. environmental sensors) or programmatic detectors that receive or interpret conditions from network data (as described below). As an addition or alternative, the predetermined conditions are detected from segment-specific detectors 140, 142, 144 as described above. The response to detecting the predetermined conditions may be made from panel-level logic (e.g. control logic 130), or from individual control elements (e.g. CSC 120, 122, 124). In each case, the response may control individual segments of the panel to maximize an output of the solar panel as a whole. In one embodiment, the predetermined conditions are detected by monitoring voltage and current output on output power lines 121 of individual segments 111, 113, 115, or on the power lines 127 supplied from individual segments. Still further, the detection of the predetermined conditions may be performed by control logic 130 interfacing with voltage and/or current regulators 134, output lines 139 to the junction box 141 output. In such embodiments, the control logic 130 may identify, for example, a load input or requirement from the panel. For example, the control logic 130 may be coupled or connected to junction box 141 output to determine the load input.

As mentioned, some embodiments provide for use of one or more external detectors 148, including a clock or environmental sensors, such as those used to detect ambient temperature, luminosity, or other environmental conditions that affect some or all of the solar panel. Weather, for example, may cause the control logic 130 to re-optimize desired power settings. For example, in extreme hot or cold weather, the control logic 130 may accept lower efficiency from the segments, and adjust output thresholds accordingly.

As another addition or alternative, the control logic 130 is connected to a network interface 160. The network interface enables network communications to be sent to (or received from) the control logic 130. The network interface 160 enables, for example, control settings to be communicated to the control logic 130 based on a centralized, remote controller that takes into account factors such as the weather at the location of the panel. Alternatively the network interface 160 receives weather reports and interprets environmental conditions from them. Thus, the network interface 160 enables another resource from which control resource 130 can detect or determine the existence of predetermined conditions.

Still further, some embodiments provide for control logic 130 to send out data, including malfunction errors or other communications that may indicate the panel or some other component requires service. For example, if the panel is not performing well (e.g. section breaks after a storm), a report is communicated out to a service or operator (including possibly the home owner) to indicate that the panel's performance is below an acceptable or expected level.

According to an embodiment, control logic 130 combines with the CSC 120, 122, 124 to selectively switch and/or control output of individual segments 110, 112, 114 in response to the detected conditions. The multiple CSC are operated in order to (i) optimize output of the panel as a whole, given performance of individual segment; (ii) optimize performance of individual segments; (iii) optimize performance of a whole system that uses multiple panels. In particular, embodiments recognize that performance degradation in one or more segments 110, 112, 114 can disproportionately affect performance of the panel as a whole or system as a whole. Accordingly, the control logic 130 selectively switches segments 110, 112, 114 that are degrading the output or performance of the entire panel, while maintaining those segments 110, 112, 114 that maintain or enhance performance of the panel. Still further, some embodiments recognize that even those segments that have a degraded output (due to, for example, shade) can be kept alive on the panel, so long as others that are diminutive to performance are selectively switched off.

Control Elements

Figure 2:
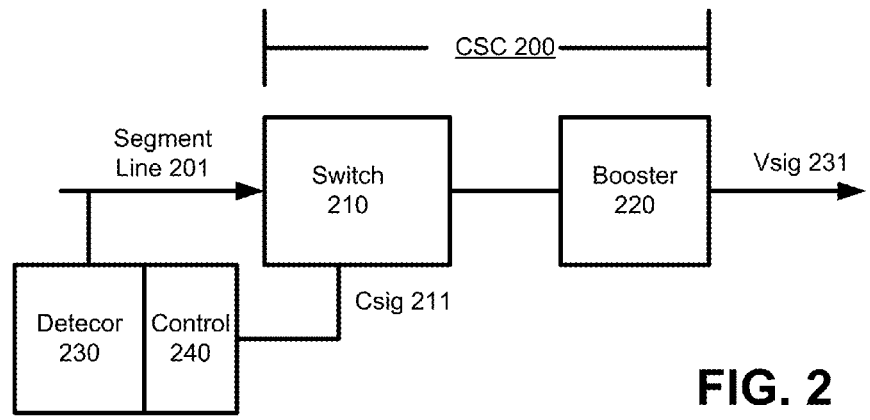
FIG. 2 illustrates a CSC that is provided on a segment line (to connect to a corresponding segment), under an embodiment.

FIG. 2 illustrates a CSC that is provided on a segment line (to connect to a corresponding segment), under an embodiment. The CSC 200 is shown on segment line 201, connected to receive power from an assigned segment 208. In some embodiments, the CSC 200 is provided as integrated or embedded circuitry and components of the panel. The CSC 200 includes (i) switch 210, and (ii) booster 220. In one embodiment, the switch 210 is frequency controlled to maximize power on the segment line. In maximizing the power on the line, the switch 210 is operated at a frequency that sets the voltage and current to values that create the maximum power output. The segment detector 230 may make measurements on the segment line 201 to determine power and current levels. The determination of segment detector 230 may affect control components 240 that set the frequency of the switch 210. In particular, control signal 211 originates from the segment detector 230 (via control component 240), or from the control logic 130 (see FIG. 1), in order to (i) adjust frequency or (ii) cut-off the segment to avoid panel degradation. The booster 220 uses voltage and current readings from the segment detector 230 to increase or decrease voltage under Ohm's law. In one implementation, the booster 220 operates to ensure that the voltage output 231 on the segment line 201 is of a optimum value, such as that value required to be handled by a power inverter. In other implementations, the booster 220 operates intelligently, to optimize voltage levels based on other conditions, such as output from other lines or load conditions. A control signal may optionally be supplied to the booster 220 (from control logic of the panel, or segment detector 230) to enable intelligent performance.

Figure 3:
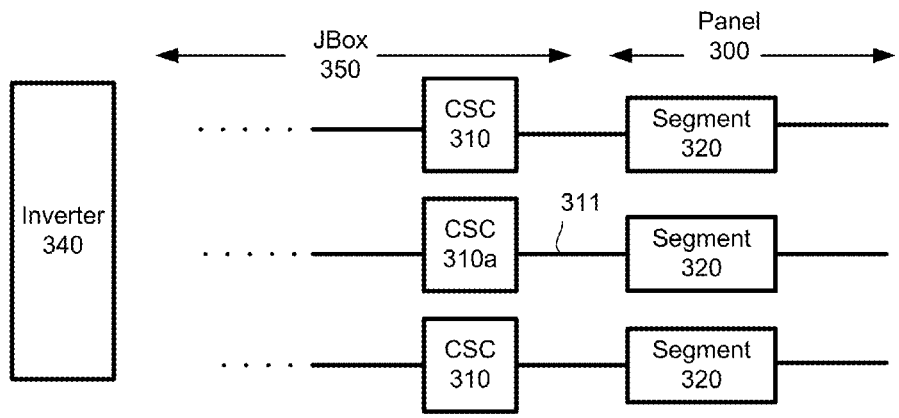
FIG. 3 illustrates an arrangement for implementing control and switch elements on panel segments connected in parallel, according to an embodiment.

FIG. 3 illustrates an arrangement for implementing CSC on panel segments connected in parallel, according to an embodiment. With reference to FIG. 3, the CSC 310 of one segment 320 can boost or cut-off the output on segment line 301. Embodiments recognize that the segments 310, structured in parallel on the panel 300, enable CSC 310 to simply switch the affected segment off, without affecting the remainder of the segments of the panel 300. Thus, a condition affecting one segment (e.g. partial shading) does not disproportionately degrade the output of the entire panel. According to some embodiments, each CSC 310 is responsive to a condition on the line of the corresponding segment 320 (e.g. as determined from voltage or current). As an addition or alternative, each CSC 310 may be individually signaled from control logic that responds to a condition that is determined from the panel as a whole. As described with an embodiment of FIG. 1, a junction box 350 may receive power from the segments 310, and include control logic, network interface, and/or regulators (as described with an embodiment of FIG. 1). The junction box may connect to the inverter(s) 340, so that the collective output of the segments 320 are supplied to an inverter 340 via the junction box output (see FIG. 1).

Figure 4:
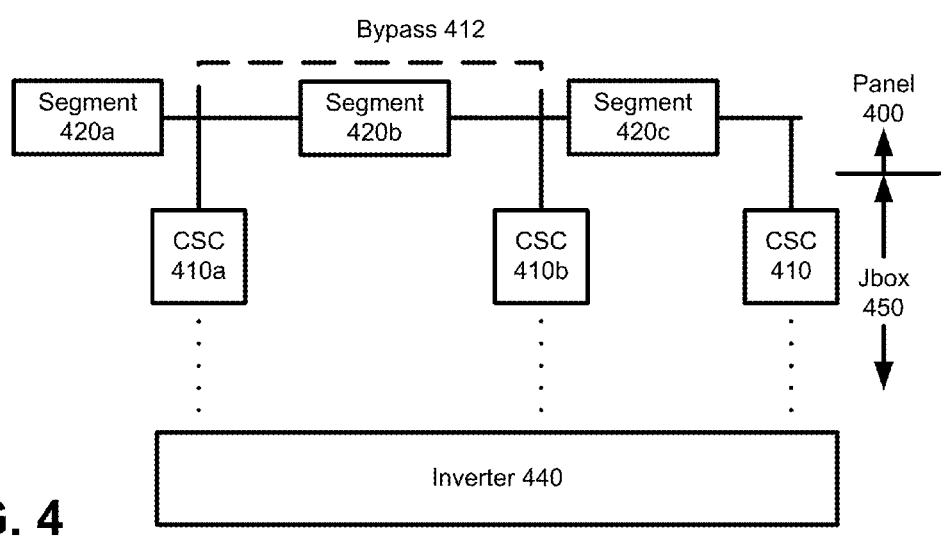
FIG. 4 is a simplified illustration of an arrangement for implementing control and switch elements on panel segments connected in series, under an embodiment.

FIG. 4 is a simplified illustration of an arrangement for implementing CSC on panel segments connected in series, under an embodiment. In many conventional solar panels, solar cells are arranged in series in serpentine fashion. Similarly, embodiments recognize that for panel 400, CSC 410 may be implemented in series between segments (which can be more than one solar cell). The segments 420 arranged in series have inputs and outputs that float, based on performance or output of the preceding element. According to some embodiments, the CSC 410 is provided between at least some of the segments connected in series. The CSC 410 can be positioned and structured to monitor the output of individual segments 410 to determine acceptable power output, moderate power output, or unacceptable power output from any one segment. In some embodiments, the CSC 410 includes switch elements 420 that are structured to switch on a bypass 412 for a given segment, in response to designated conditions that include determining that particular segment is not performing. In the example provided, a first segment 420a has no detectable problems as detected by CSC 410a, and its output is supplied to a second segment 420b. The second CSCb 420 detects a predetermined condition that it may treat, such as with boost (as described with prior embodiments) or power setting (as described with prior embodiments). The second CSC 410b may alternatively (if the condition is sufficient) switch the second segment 420b off, and implement bypass 412 to cut-off the output of the second segment 420b, while simultaneously directing the input of the second segment 420b to the third segment 420c. Thus, the determination for implementing bypass 412 may be based on, for example, voltage or current readings from the particular segment (particularly as compared to voltage or current readings of a prior segment), or sensor information (e.g. luminosity over particular segment is low). Each CSC 410 may operate and perform similar functions described with an embodiment of FIG. 3, with the added function of switching into the bypass 412, rather than switching off. The bypass 412 removes the dependency of succeeding segments on the affected segment.

With reference to FIG. 4, other embodiments provide that the individual CSC elements 410a, 410b, 410c may buck or boost the output of one segment into another. The CSC elements 410a, 410b, 410c may track desired or expected output from each segment (which, when connected in series, float). The CSC elements 410a, 410b, 410c, either operating individually or with panel-level logic 430, may boost or buck output from one segment into the other when predetermined conditions occur (e.g. output from one segment drops).

Figure 5:
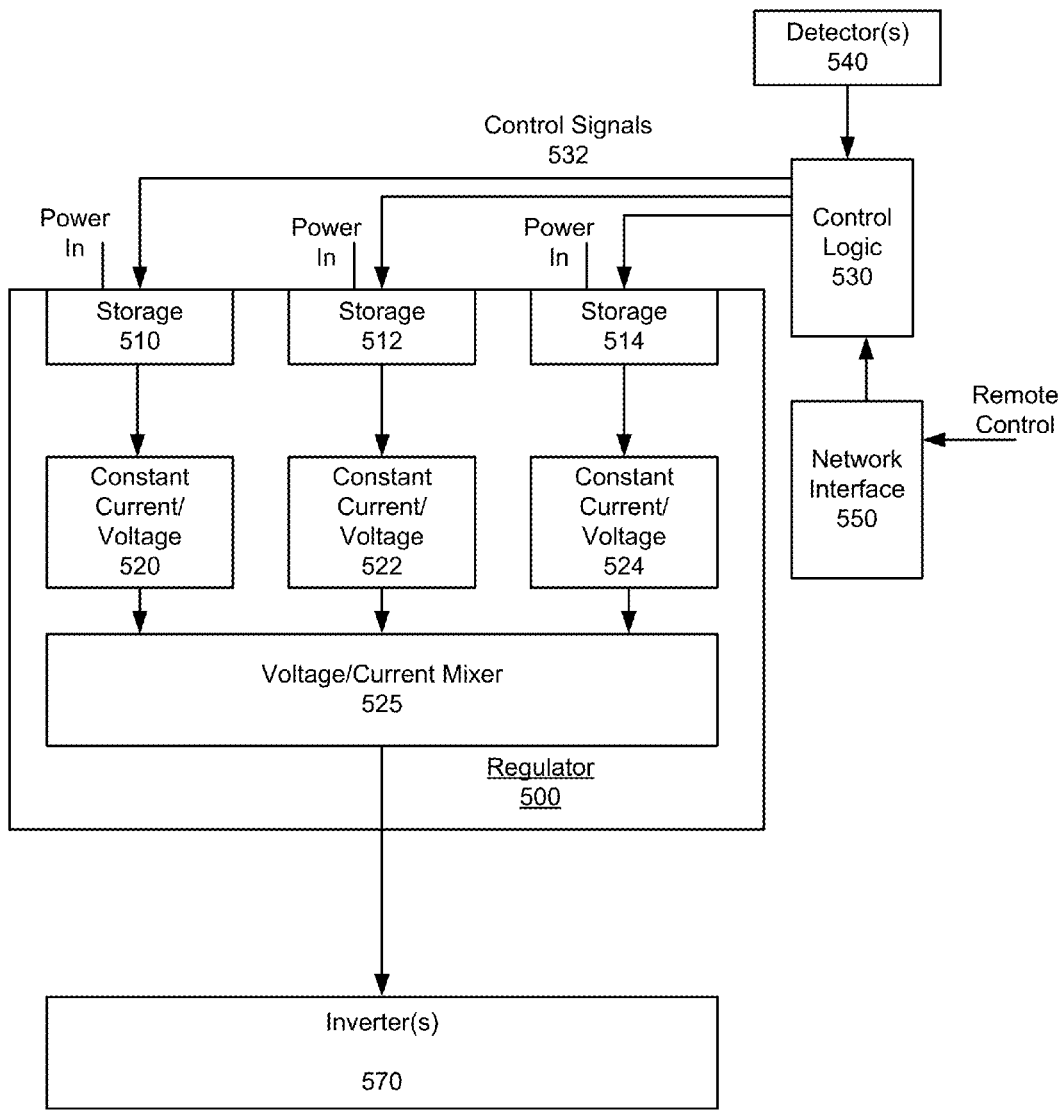
FIG. 5 illustrates a regulator for use with any of the embodiments described.

FIG. 5 illustrates a regulator for use with any of the embodiments described. A regulator 500 serves to intake power from segments of the solar panel, and regulate output from the panel for voltage and current. The output of the regulator may be supplied to an inverter 570. According to some embodiments, regulator 500 includes one or more individual intake storage elements 510, 512, 514 for corresponding segments. Each storage elements 510, 512, 514 outputs to a corresponding constant voltage/current regulator 520, 522, 524. The constant output is provided to a voltage/current mixer 525, which combines the voltage/current from the different sources, and ensures the operational current and voltage requirements of the inverter 570 are met. According to some embodiments, control logic 530 implements panel level control by controlling individual storage 510, 512, 514 from respective segments. Control logic 530 signals control signals 532 to storage elements 510, 512, 514 to increase or decrease (i) amount charge stored in each storage element, and/or (ii) amount voltage/current signaled from the storage elements 510, 512, 514. The control logic 530 is responsive to the occurrence of predetermined conditions or input. In one embodiment, network interface 560 is used to receive data or control information from a remote source, and control logic 530 is responsive to that control. Still further, detectors 540, which include, for example, environmental sensors, may provide information to the control logic to identify the occurrence of the predetermined conditions. Detectors 540 may also read current voltage values from, for example, the bus that extends from some or all of the individual segments.

According to some embodiments, the control logic 530 may increase the output from one of the storage elements 510, 512, 514 when one of the segments is providing lesser output than the other segments. In such instances, the predetermined condition corresponds to the output from one of the segments, and the control signals 532 trigger increase power out of storage elements 510, 514, 516 corresponding to other segments.

In other applications, the control logic 530 can detect a condition corresponding to when the panel, or individual segments, produces more power than specified than operational parameters of the system (e.g. too much sunshine with luminating cloud cover). The control logic 530 may reduce the power output from one or more of the storage elements 510, 512, 514 in response to such conditions.

Still further, the network interface can receive control information, such as information indicating 'down time' for the load, and then use the control logic to reduce the output from the storage elements 510, 512, 514.

As an addition or alternative, the output from the regulator 500 may supply power to a battery source (rather than the inverter 570). When the battery is fully charged, the power output from the storage elements 510, 512, 514 may be reduced.

Methodology

Figure 6:
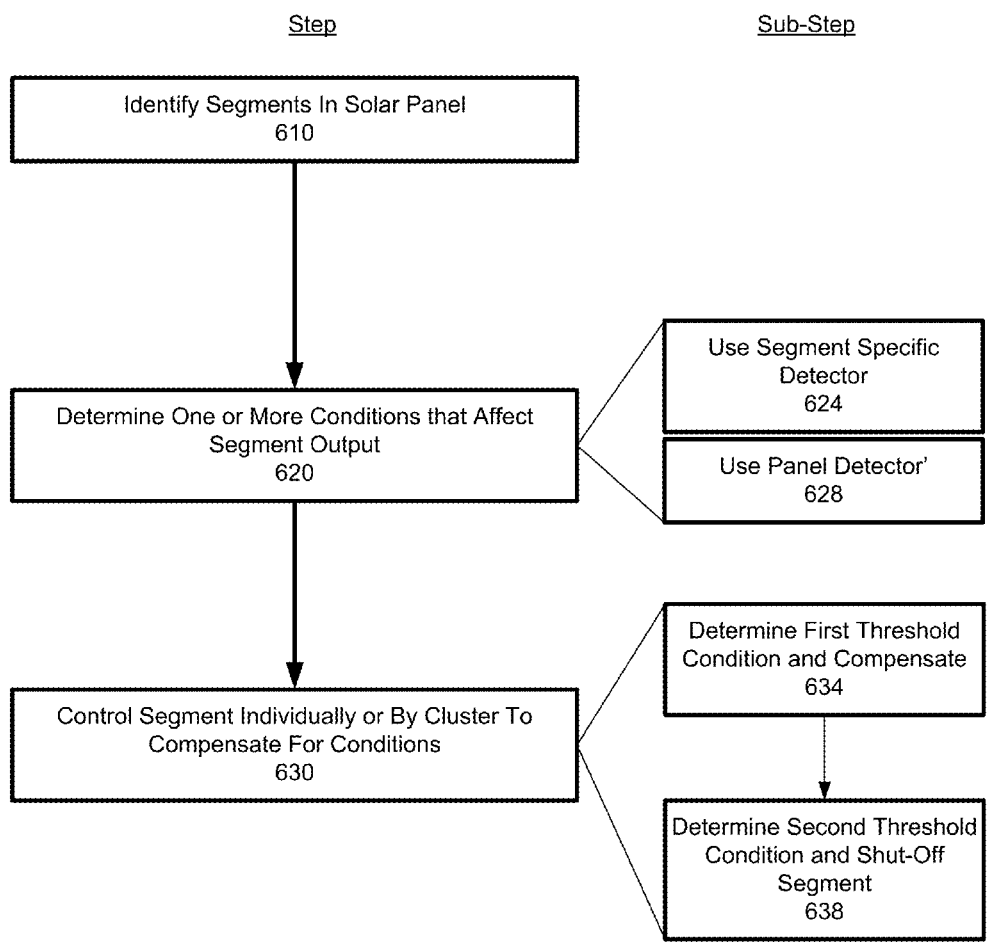
FIG. 6 illustrates a method for controlling a solar panel, according to one or more embodiments.
Figure 7:
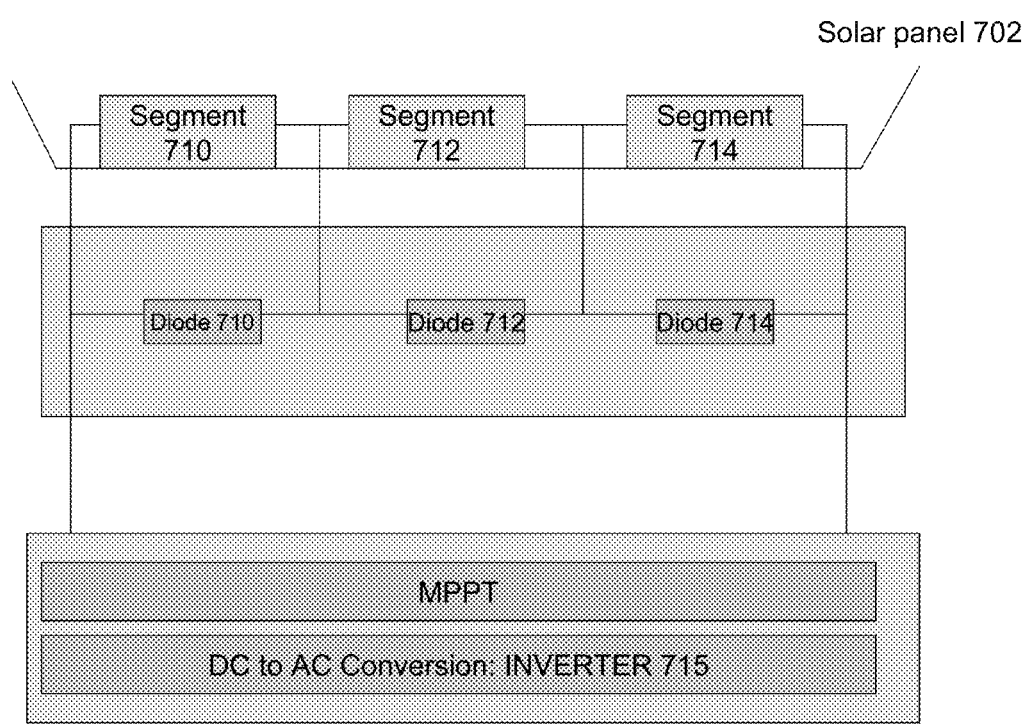
FIG. 7 illustrates a conventional control system for a solar panel, under the prior art.

FIG. 6 illustrates a method for controlling a solar panel, according to one or more embodiments. In describing a method, reference is made to elements of FIG. 1 for purpose of illustrating elements suitable for performing a step or sub-step being described.

According to an embodiment, a panel is segmented, either in series or in parallel, so that it is divided (step 610). Each segment 120 may be associated with a control element (e.g. CSC 120, 122, 124) that is individually controllable to effect an output from that segment.

One or more predetermined conditions are then detected (step 620). Predetermined conditions may be segment specific, so as to be detected using one of the segment specific detectors 140, 142, 144 (sub-step 624). Such detectors may, for example, detect an output of that segment, and detect that segment has dropped off. A panel detector 148 may also be used, such as one that detects environmental conditions or operates in connection with network interface 160 (sub-step 628).

In step 620, the segments, either individually or in groups, or controlled to compensate for the detected conditions. As described with other embodiments, the compensation may include (i) switching one particular segment off (in response to, for example, output readings from that segment which indicate its performance is degrading the panel); (ii) setting voltage and current to maximize power from the segment; and/or (iii) increasing voltage (and dropping current). CSC elements 120, 122, 124 associated with each segment may be used to implement the compensation.

According to one embodiment, predetermined conditions that affect the individual segments are detected in stages. When a first threshold condition is detected (634), respective CSC 420, 422, 424 boost or optimize the output of the segment compensate. If a second threshold is detected, the CSC 420, 422, 424 of the respective segment shut that segment off (638). Each CSC may be self-controlled (e.g. include logic and detectors that operate independently on that segment) and/or centrally controlled (via control logic 130). When segments are interconnected in parallel, individual CSC elements can switch off select segments without further consideration. When segments are interconnected in series, switch off of individual segments may be performed via a bypass.

Alternatives

While numerous embodiments described include segmenting a panel and assigning control elements to the individual segments, embodiments recognize that panels may be constructed to be compact and part of a larger array of panels. In such embodiments, the panel and segment may be the same (i.e. one segment per panel), and the array of panels may comprise segments of panels ("array segments") that are interconnected in series or in parallel. Control elements such as described may be implemented to control individual array segments (i.e. one or more panels). Specifically, embodiments provide for array segments, interconnected in parallel or in series, which can be assigned individual control elements (e.g. control and switch elements) in order to (i) set the voltage/current from the array segments to optimal or maximum levels; (ii) boost the voltage from the array segments, and (iii) cut the array segments off from the array. In some embodiments, the array segments are interconnected in parallel, in which case one array segment may be shut off without affecting other array segments. A bypass such as described with an embodiment of FIG. 4 may also be implemented for array segments connected in series.

As an addition or alternative, the output from a controlled solar power system may be supplied to a battery, or bank of batteries (rather than to an inverter). In such embodiments, the control elements and logic may take into account predetermined conditions that are inherent in charging a battery or battery bank. For example, as described with an embodiment of FIG. 5, the output from the junction box or regulator may be intentionally dropped when the battery is deemed fully charged.

Although illustrative embodiments have been described in detail herein with reference to the accompanying drawings, variations to specific embodiments and details are encompassed herein. It is intended that the scope of the invention is defined by the following claims and their equivalents. Furthermore, it is contemplated that a particular feature described, either individually or as part of an embodiment, can be combined with other individually described features, or parts of other embodiments. Thus, absence of describing combinations should not preclude the inventor(s) from claiming rights to such combinations.

What is claimed is:

1. A control system for a solar panel, the control system comprising:
    a plurality of control elements to individually connect to a corresponding segment of a plurality of segments of the solar panel, each segment (i) comprising a plurality of solar cells, and (ii) corresponding to only a portion of the solar panel;
    a regulator comprising a plurality of storage elements that are individually connected to a corresponding control element; and
    a control logic that is coupled to the plurality of control elements and the regulator, the control logic to (i) individually signal one or more of the plurality of control elements in order to cause the one or more signaled control elements to either switch-off or after performance output, and (ii) individually signal one or more of the plurality of storage elements in order to cause the one or more signaled storage elements to adjust an amount of charge stored in the one or more signaled storage elements.

2. The control system of claim 1, wherein each of the control elements either switches-off or alters performance output by (i) adjusting an electrical output of the associated segment independently of an electrical output of other segments, or (ii) cutting-off the associated segment without affecting an output of the other segments.

3. The control system of claim 1, wherein the plurality of segments are interconnected in parallel, and wherein the control logic individually signals the control element associated with each segment connected in parallel.

4. The control system of claim 1, wherein the plurality of segments are interconnected in series, wherein the control element associated with each segment is structured to implement a bypass to remove dependency of an output of that segment by another segment connected in series, and wherein the control logic individually signals the control element associated with each segment in order to implement the bypass at that segment.

5. The control system of claim 1, wherein the control logic individually signals the one or more of the plurality of control elements in response to detecting a predetermined condition.

6. The control system of claim 5, wherein the predetermined condition corresponds to an output of one or more segments of the solar panel being less than a predetermined threshold.

7. The control system of claim 1, wherein each of the plurality of control elements includes a detector that detects a predetermined condition that is specific to the segment that is associated with that control element, and wherein the control logic receives information of the predetermined condition from each of the plurality of control elements.

8. The control system of claim 7, further comprising a network interface that is coupled to the control logic in order to receive information corresponding to the predetermined condition.

9. The control system of claim 1, wherein the regulator further comprises a plurality of regulator components that are individually connected to a corresponding storage element.

10. The control system of claim 9, wherein the control logic further individually signals one or more of the plurality of storage elements in order to cause the one or more signaled storage elements to adjust an amount of voltage or current signaled from the one or more signaled storage elements to a corresponding regulator component.

11. A system comprising:
a solar panel that comprises a plurality of segments, each segment (i) comprising a plurality of solar cells, and (ii) corresponding to only a portion of the solar panel;
an inverter; and
a control system comprising:
a plurality of control elements that are individually connected to a corresponding segment of the plurality of segments;
a regulator comprising a plurality of storage elements that are individually connected to a corresponding control element; and
a control logic that is coupled to the plurality of control elements and the regulator, the control logic to (i) individually signal one or more of the plurality of control elements in order to cause the one or more signaled control elements to either switch-off or alter performance output, and (ii) individually signal one or more of the plurality of storage elements in order to control the one or more signaled storage elements.

12. The system of claim 11, wherein each of the control elements either switches-off or alters performance output by (i) adjusting an electrical output of the associated segment independently of an electrical output of other segments, or (ii) cutting-off the associated segment without affecting an output of the other segments.

13. The system of claim 12, wherein each of the control elements includes (i) a switch component to switch-off the corresponding segment of the plurality of segments, (ii) a voltage boost component to increase the electrical output of the corresponding segment, and (iii) a converter component to decrease the electrical output of the corresponding segment.

14. The system of claim 11, wherein the control logic individually signals the one or more of the plurality of control elements in response to detecting a predetermined condition.

15. The system of claim 14, wherein the predetermined condition corresponds to an output of one or more segments of the solar panel being less than a predetermined threshold.

16. The system of claim 11, wherein each of the plurality of control elements include a detector that detects a predetermined condition that is specific to the segment that is associated with that control element, and wherein the control logic receives information of the predetermined condition from each of the plurality of control elements.

17. The system of claim 11, wherein the control system further comprises a network interface to communicate with a remote controller.

18. The system of claim 11, wherein the regulator further comprises a plurality of regulator components that are individually connected to a corresponding storage element.

19. The system of claim 18, wherein the control logic individually signals the one or more of the plurality of storage elements in order to cause the one or more signaled storage elements to (i) adjust an amount of charge stored in the one or more signaled storage elements, or (ii) adjust an amount of voltage or current signaled from the one or more signaled storage elements to a corresponding regulator component.

20. The system of claim 18, wherein the regulator further comprises a mixer component to combine voltages or currents from each of the plurality of regulator components.

* * * * *